United States Patent [19]

Schweitzer, Jr.

[11] Patent Number: 4,795,982

[45] Date of Patent: Jan. 3, 1989

[54] FAULT INDICATOR HAVING DELAYED TRIP CIRCUIT

[76] Inventor: Edmund O. Schweitzer, Jr., 2433 Center St., Northbrook, Ill. 60062

[21] Appl. No.: 42,282

[22] Filed: Apr. 24, 1987

[51] Int. Cl.⁴ ............................................. G01R 31/02
[52] U.S. Cl. ..................................... 324/508; 324/543
[58] Field of Search ............... 324/146, 133, 508, 512, 324/522, 524, 555, 543, 126; 340/660, 662, 664; 361/93, 94, 110, 71, 75

[56] References Cited

U.S. PATENT DOCUMENTS

| | | | |
|---|---|---|---|
| 4,063,171 | 12/1977 | Schweitzer, Jr. | 324/133 |
| 4,234,847 | 11/1980 | Schweitzer, Jr. | 324/146 |
| 4,251,770 | 2/1981 | Schweitzer, Jr. | 324/133 |
| 4,263,550 | 4/1981 | Schweitzer, Jr. | 324/133 |
| 4,438,403 | 3/1984 | Schweitzer, Jr. | 324/133 |
| 4,458,198 | 7/1984 | Schweitzer, Jr. | 324/133 |

Primary Examiner—Reinhard J. Eisenzopf
Assistant Examiner—Anthony L. Miele
Attorney, Agent, or Firm—Lockwood, Alex, FitzGibbon & Cummings

[57] ABSTRACT

A reset coordinated fault indicator for indicating the occurrence of a fault current in a monitored conductor includes an electrically actuated indicator flag. A trip circuit within the fault indicator impulses the indicator flag from a normal reset-indicating state to a fault-indicating state following the occurrence of a fault current in the conductor. A reset circuit periodically impulses the indicator flag to the reset-indicating state upon restoration of power to the conductor. To preclude simultaneous actuation of the trip and reset circuits and consequent failure of the indicator flag to register a fault, the trip circuit, upon the occurrence of a fault, first actuates the reset circuit to render the reset circuit inoperative, and then actuates the indicator flag to provide a fault indication.

19 Claims, 7 Drawing Sheets

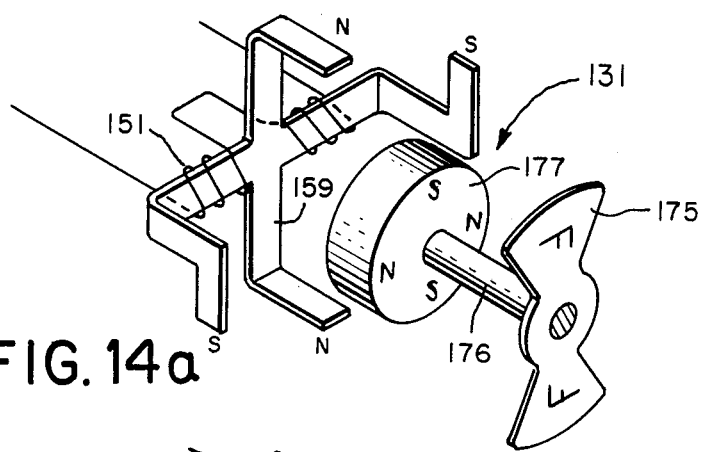 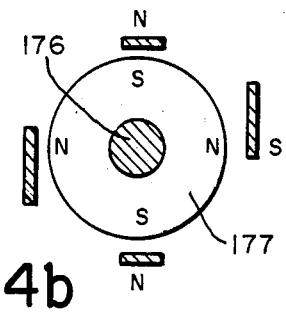
FIG. 14a  FIG. 14b
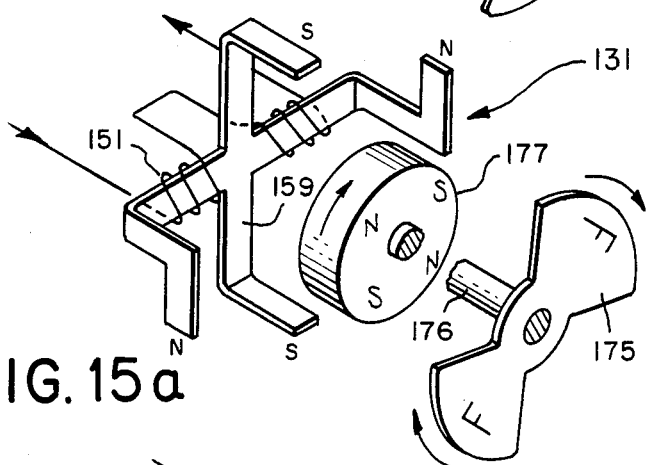 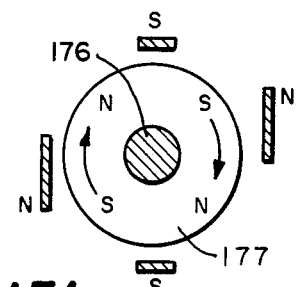
FIG. 15a  FIG. 15b
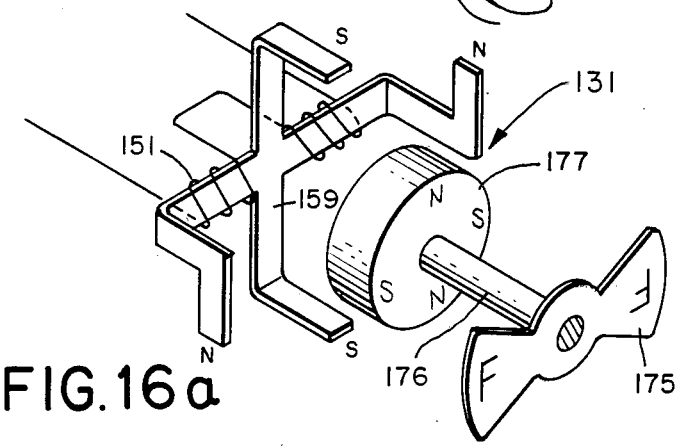 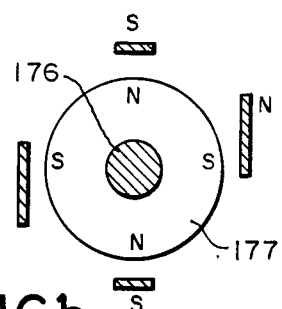
FIG. 16a  FIG. 16b
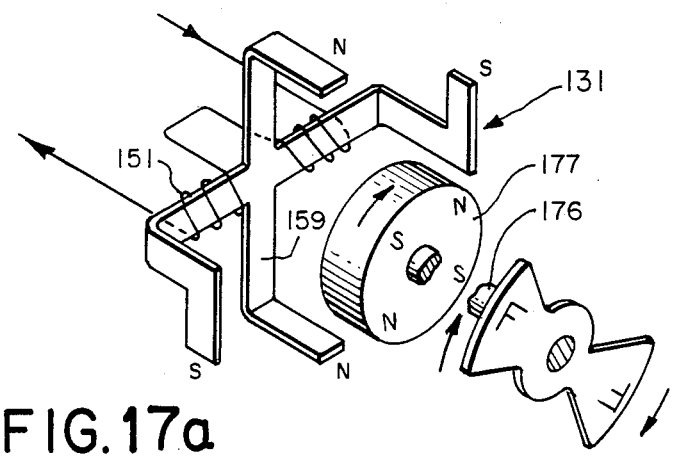 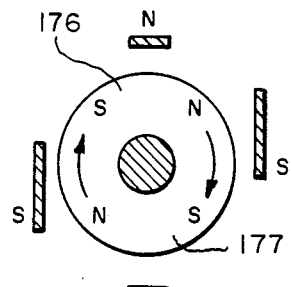
FIG. 17a  FIG. 17b

FAULT INDICATOR HAVING DELAYED TRIP CIRCUIT

BACKGROUND OF THE INVENTION

The present invention relates generally to fault indicators for alternating current electrical distribution systems, and more particularly to self-resetting fault indicators wherein upon occurrence of a fault the reset circuit of the indicator is actuated before the trip circuit thereof to preclude simultaneous actuation of the two circuits.

Fault indicators of various types have been constructed for detecting faults in electrical power distribution systems. Such indicators include clamp-on type indicators, which clamp directly over cables in the system, and test point-type indicators, which are mounted on test points provided on connectors or components of the system. Fault indicators of both types may be either of the manually reset type, wherein it is necessary that the indicator be physically reset following each fault, or of the automatically reset type, wherein a fault indication is reset upon restoration of line current. Examples of such fault indicators are found in products manufactured by E. O. Schweitzer Manufacturing Company of Mundelein, Ill., and in U.S. Pat. Nos. 4,063,171, 4,234,847, 4,251,770, 4,236,550 4,438,403 and 4,458,198 of the present inventor.

Self-resetting fault indicators typically employ an indicator device, a trip circuit for conditioning the indicator device to indicate a fault upon occurrence of a fault current in a monitored conductor, and a periodically-actuated reset circuit powered by the monitored conductor for conditioning the indicator device to a reset state upon occurrence of normal current in the monitored conductor. Because the reset circuit is actuated at periodic intervals in the presence of current on the monitored conductor, there exists the possibility that the reset circuit will actuate at the same time the trip circuit actuates in response to a fault current, and the indicator will therefore fail to respond to the fault, providing the user with erroneous information that a fault did not occur.

SUMMARY OF THE INVENTION

The invention is directed to a fault indicator for indicating the occurrence of a fault current in an electrical conductor of an alternating current power distribution system. The indicator includes status indicating means having reset-indicating and fault-indicating states. Trip circuit means condition the status indicating means to the fault-indicating state in response to the occurrence of a fault current in the conductor. Reset circuit means periodically condition the status indicating means to the reset-indicating state in the presence of voltage on the conductor. The trip circuit means actuate the reset circuit means upon occurrence of a fault prior to conditioning the status indicator means to the fault-indicating state to preclude simultaneous actuation of the reset and trip circuit means.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIGS. 14a and 14b are diagrammatic views of principal indicator components of the fault indicator illustrated in FIGS. 9 and 10 in a reset state.

FIGS. 15a and 15b are diagrammatic views similar to FIGS. 14a and 14b, respectively, showing the indicator components of the fault indicator in transition between a reset state and a tripped state.

FIGS. 16a and 16b are diagrammatic views similar to FIGS. 14a and 14b, respectively, showing the indicator components of the fault indicator in a tripped state.

FIGS. 17a and 17b are diagrammatic views similar to FIGS. 14a and 14b, respectively, showing the indicator components of the fault indicator in transition between a tripped state and a reset state.

DESCRIPTION OF THE PREFERRED EMBODIMENT

Figure 1:
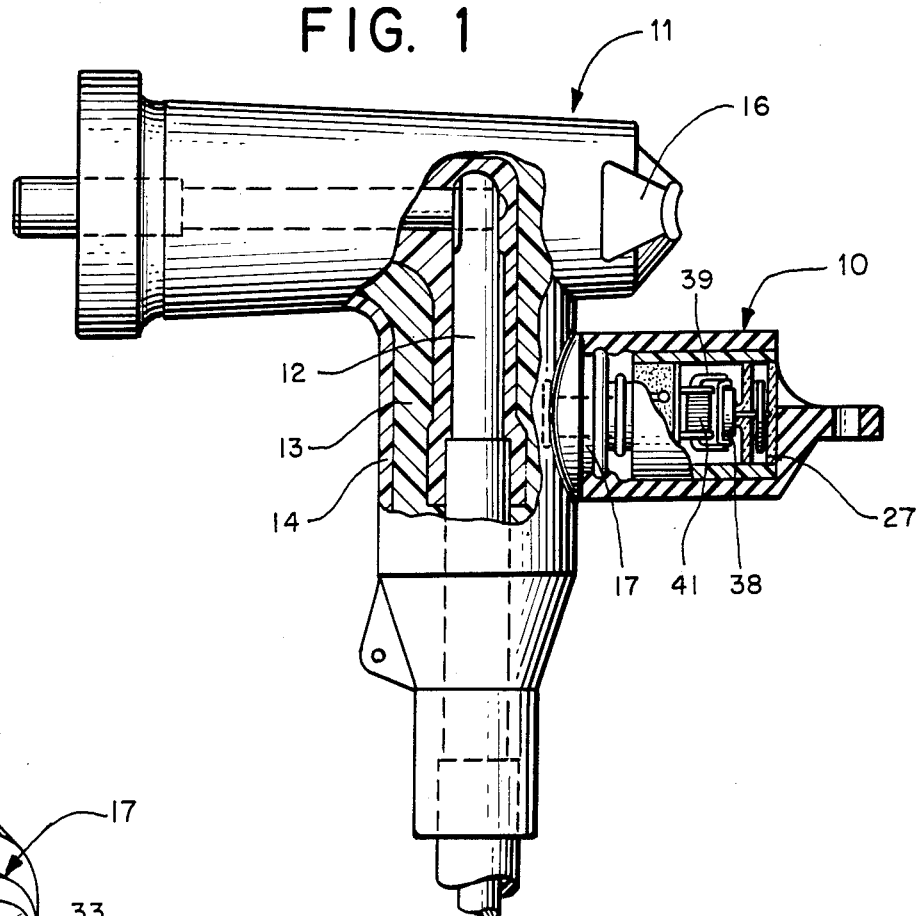
FIG. 1 is a side elevational view, partially in section, illustrating an reset-coordinated self-resetting fault indicator constructed in accordance with the present invention mounted on the test-point terminal of a conventional elbow-type terminal connector.
Figure 2:
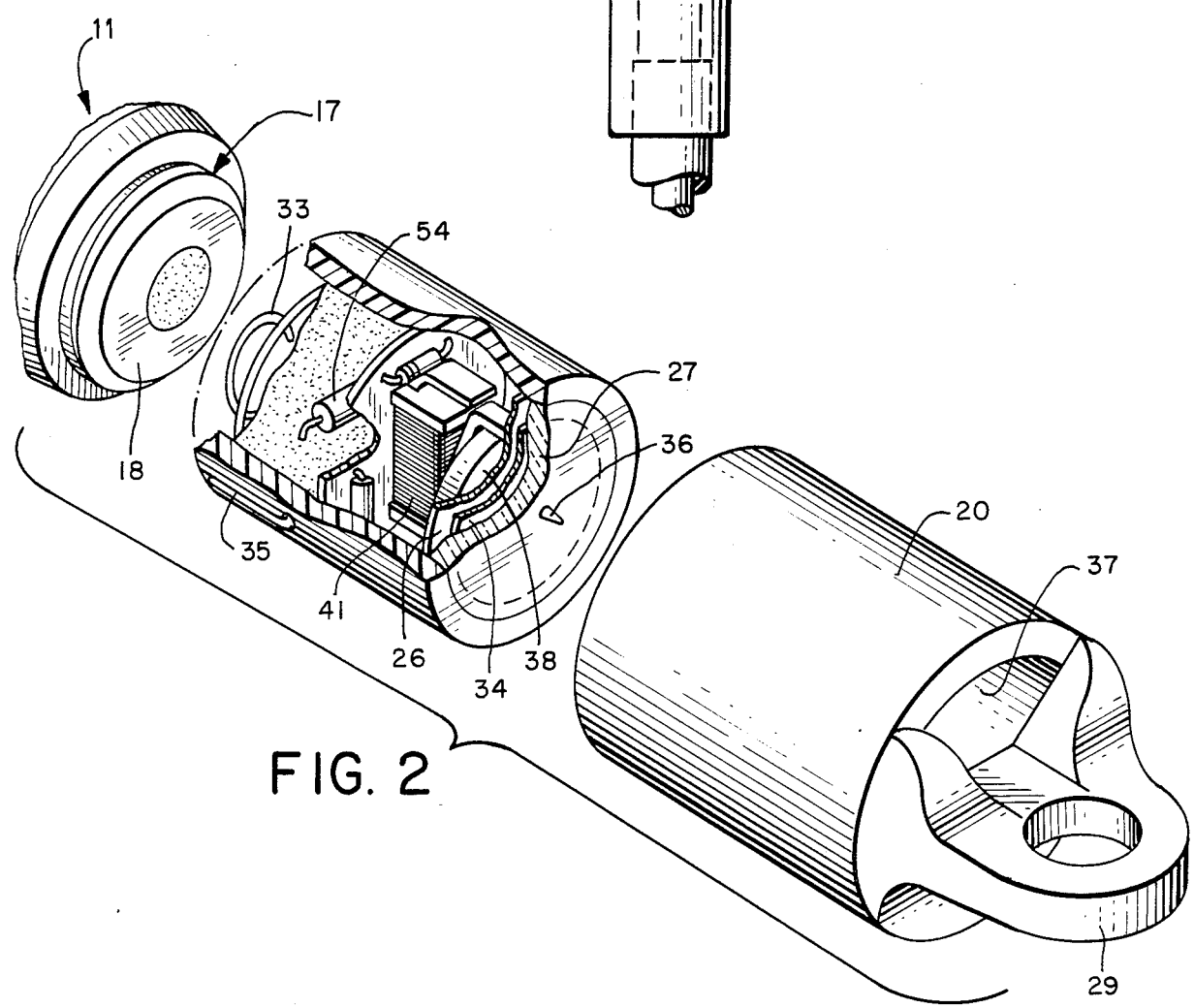
FIG. 2 is a fragmentary perspective view of the fault indicator of FIG. 1 in a partially disassembled state.

Referring to the drawings, and particularly to FIGS. 1 and 2, a trip-inhibited fault indicator 10 constructed in accordance with the invention is shown installed on a plug-in elbow connector 11 of conventional construction for use in high voltage alternating current system for establishing a plug-in connection to a transformer (not shown) or other device. As shown, the connector 11 includes generally an axial conductor 12 extending through an electrically insulating body portion 13 encased in an electrically-conductive sheath 14, the sheath being grounded in accordance with conventional practice. An arcuate member 16 having ends anchored in sheath 14 extends from the connector to receive the hooked end of a lineman's tool commonly used to remove plug-in connectors from such devices.

Elbow connector 11 includes a test point terminal 17 for receiving a circuit condition indicating device, in this case fault current indicator 10. The test point is formed by a portion of the insulating body layer 13, which projects radially through the conductive sheath 14. Embedded in the test point terminal 17 is an electrically conductive contact 18 which is exposed at its outer end to provide for an electrical connection to the contact, and which at its inner portion is positioned in proximity to conductor 12 to capacitively couple the contact to the conductor.

The housing of fault indicator 10 includes an electrically conductive semi-flexible rubber outer shell 20 which is open and dimensioned at one end for engaging test point 17. The shell 20 receives a correspondingly sized cylindrical plastic housing 21 in which the electrical components of the fault indicator device are contained. The cylindrical housing includes an integral partition 26 which serves as a mask and spacing element, and a transparent end cap 27 which is sonically welded to the end of the housing. At the closed end of shell 20, an apertured tab 29 is provided to facilitate installation and removal of the fault indicator with a conventional hooked lineman's tool.

Referring to FIG. 2, a disc-shaped circuit board 31 is positioned within housing 21 perpendicular to the axis of the housing at a location intermediate the ends thereof. The circuit board, which may be secured in position by an epoxy material 32, serves as mounting means for the electrical components of the fault indicator. An electrical connection is established between this circuitry and test point contact 18 by means of a helical spring 33, the spring being connected at one end to a wire conductor extending from the circuit board, and being resiliently pressed at the other end against contact 18. An electrical ground connection is established to the circuit board by means of an additional electrical conductor 35 compressively wedged between housing 21 and the electrically conductive outer shell 20 grounded through sheath 14.

To provide an indication of the occurrence of a fault current in conductor 12, the fault indicator includes within the lower end of housing 21 a disc-shaped target member 34 which is mounted for rotation on a pivot shaft 36. The face of the target disc has a red segment 34a (FIGS. 4-6) and a white segment 34b, each comprising one-half of the target face, and only one of which is visible at a time through a window 37 provided in shell 20 and the end cap 27 of housing 21.

Secured to and pivotal with target 34 member is a disc-shaped target actuator magnet 38, which is formed of a magnetic material having a high coercive force, such as ceramic, and which is magnetically polarized to form two magnetic poles of opposite magnetic polarity, as indicated in FIGS. 4-6. The actuator magnet 38, and hence the target member 34, are rotated between reset-indicating and fault-indicating positions by rotational forces exerted on the magnet by means of a stationary generally U-shaped magnetic pole piece 39, which is located within housing 21 with the projecting poles thereof diametrically opposed and adjacent the edge of the magnet.

Figure 4A:
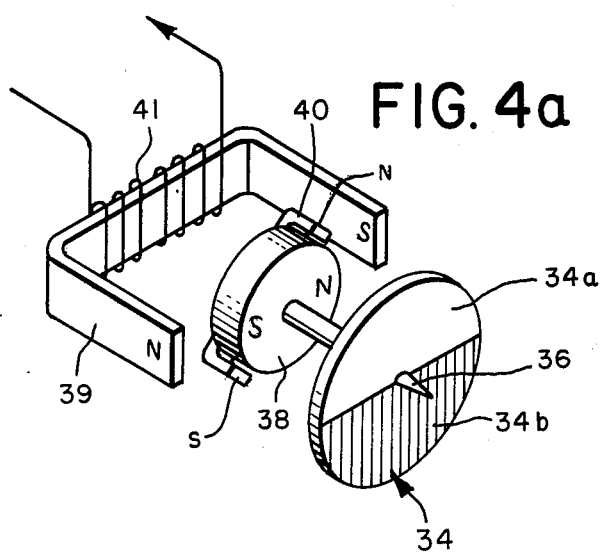
FIGS. 4a and 4b are diagrammatic views of principal indicator components of the fault indicator in a reset state.
Figure 4B:
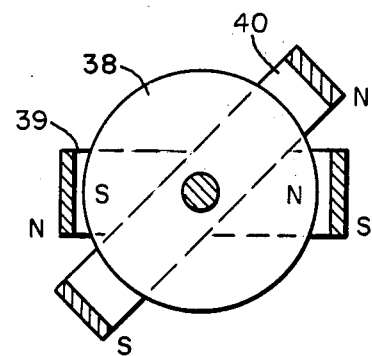

When the fault indicator is in a reset-indicating state, pole piece 39, which is preferably formed of a magnetic material having a relatively low coercive force, such as a chrome steel, is magnetized at its projecting poles to the magnetic polarities indicated in FIGS. 4a-4b. As a result, the opposite polarity magnetic poles of the target magnet are attracted to position the target member 34 as shown. In this position the red segment 34a of the target disc is not visible through window 37, and only the white segment 34b is visible to indicate to an observer that the indicator is in the reset condition.

On the occurrence of a fault current in conductor 12, which current may, for example, exceed 400 amperes, pole piece 39, and an adjacent auxiliary pole piece 40 of similar construction, are remagnetized to the magnetic polarities shown in FIGS. 5a-5b and 6a-6b by momentary energization of a magnetic winding 41 on the center section of pole piece 39. As a result, the poles of magnet 38 are repelled by the adjacent like-magnetic polarity poles of the pole pieces and the target disc is caused to rotate 180° counter-clockwise to the tripped position shown in FIGS. 6a-6b. In this position, the red segment 34b of the target disc is visible through window 37 (FIG. 2) and a lineman viewing the fault indicator is advised that a fault current has occurred in conductor 12.

Target disc 34 remains in the fault indicating position until the poles of pole pieces 39 and 40 are subsequently remagnetized to the magnetic polarities shown in FIGS. 4a-4b by momentary energiation of winding 41 with a current in the opposite direction. As a result, the target magnet 38, and hence the target disc 34, are caused to rotate from the tripped position shown in FIGS. 6a-6b to the reset position shown in FIGS. 4a-4b, and the fault indicator is conditioned to respond to a subsequent fault current.

Figure 3:
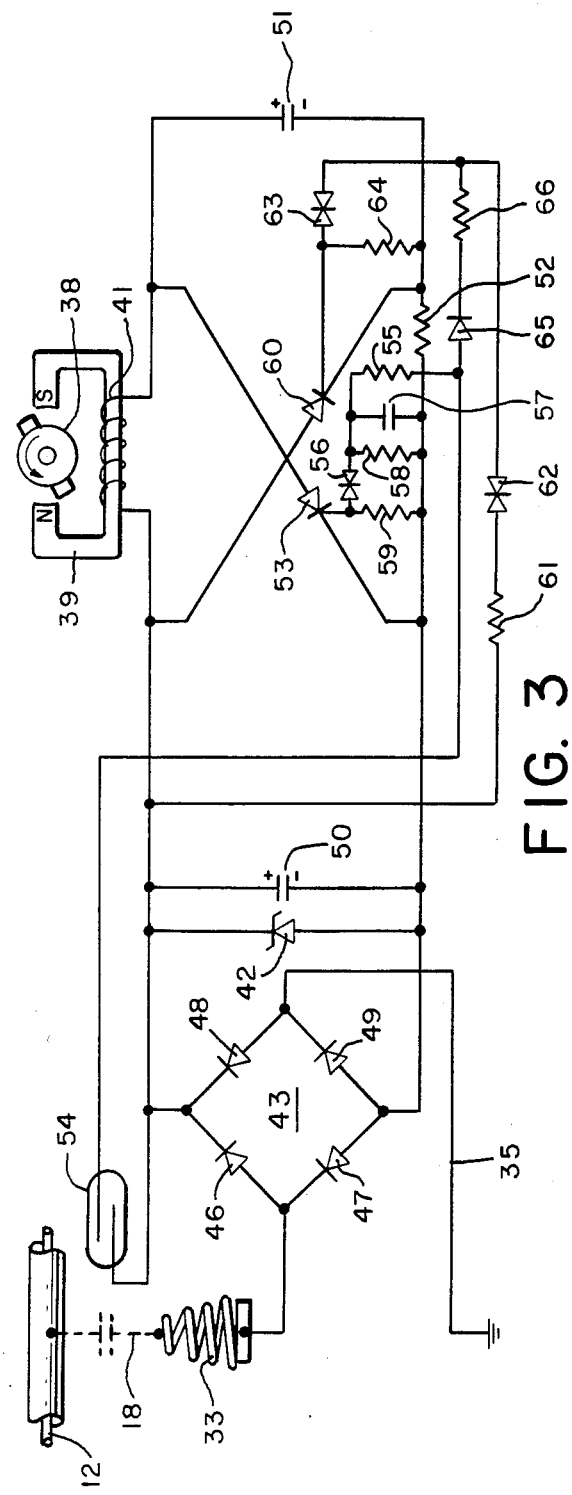
FIG. 3 is an electrical schematic diagram of the fault indicator illustrated in FIGS. 1 and 2.

Energization of winding 41 in one direction upon occurrence of a fault current in conductor 12, and energization of winding 41 in the other direction upon restoration of current in the conductor following a fault, is accomplished by means of externally-powered circuitry contained within the fault indicator. Referring to the schematic diagram shown in FIG. 3, operating power for energizing winding 41 is obtained by means of a bridge rectifier network 43, consisting of four diodes 46–49. One input terminal of this network, formed at the juncture of the anode of diode 46 and the cathode of diode 47, is connected through the helical spring 33 to test point contact 18. The other input terminal, formed at the anode of diode 48 and the cathode of diode 49, is connected to ground through the electrically conductive outer shell 20 of the fault indicator housing. With this arrangement, high voltage alternating current carried in conductor 12 is capacitively coupled to the bridge rectifier network, resulting in the production of a pulsating unidirectional current at the output terminals of the network.

The positive polarity output terminal of the bridge rectifier network is formed at the cathodes of diodes 46 and 48, and the negative polarity output terminal of the rectifier network is formed at the juncture of the anodes of diodes 47 and 49. To provide the trip and reset functions of the fault indicator, a trip capacitor 50 and a reset capacitor 51 are connected to the output terminals to receive a charge current from the rectifier network.

Trip capacitor 50 is directly connected, and reset capacitor 51 is connected through winding 41, and an isolation resistor 52. A zener diode 42 is connected across the network output terminals to limit rectifier output voltage.

To provide for energization of winding 41 in one direction upon occurrence of a fault current in conductor 12, the winding is connected to receive discharge current from trip capacitor 50 through a silicon controlled rectifier (SCR) 53 connected in series with the winding and the capacitor. Upon occurrence of a fault current, a reed switch 54, positioned within housing 21 in close proximity to conductor 12 so as to close in response to the magnetic field produced by a fault-level current, causes an enabling current to be applied from rectifier network 43 through a resistor 55 and bilateral diode 56 to the gate electrode of SCR 53 to initiate conduction through the SCR. A capacitor 57 and resistor 58 in the SCR gate circuit provide a predetermined time delay to the trip function following closure of switch 54. A resistor 59 provides a drain circuit to ground for the gate electrode.

To maintain fault indicator 10 in a reset condition in the absence of a fault current, reset capacitor 51 is periodically discharged into winding 41 in a reverse direction to the discharge current of trip capacitor 50 in the presence of voltage on conductor 12. To this end, winding 41 is connected through a silicon controlled rectifier (SCR) 60 to reset capacitor 51. Periodic conduction through SCR 60 is obtained by connecting the gate electrode of that device to the positive polarity output terminal of bridge rectifier 43 through a resistor 61 and a pair of series connected bilateral diodes 62 and 63. A resistor 64 provides a ground return for the gate electrode. Under normal current flow conditions, as trip capacitor 50 is charged by the pulsating direct current output of bridge rectifier network, reset capacitor 51 is charged through winding 41 and resistor 52. The voltage developed across the capacitors progressively increases with time, until the threshold voltage of the bilateral diodes is reached, at which time conduction is initiated through SCR 60 and capacitor 51 discharges through winding 41. Resistor 52 prevents trip capacitor 50 from being discharged with reset capacitor 51, leaving this capacitor available for powering the trip circuit. Following the discharge, SCR 60 is rendered non-conductive until the voltage level across capacitor 52 increases to the threshold voltage level of the bilateral diodes, at which time another reset cycle occurs. With the periodic energization of winding 41 in the manner magnetic pole assembly 39 is magnetized as shown in FIGS. 4a-4b with the presence of voltage on conductor 12, and flag indicator 34 is positioned as shown to indicate a reset mode.

In practice, the breakdown voltage of bilateral diodes 62 and 63 may be in order of 34 volts, and the time required for capacitor 51 to reach this threshold level with a typical voltage level of 4,400 volts on conductor 12 may be approximately 2 minutes or less. The voltage level within conductor 12 is not critical to the operation of the reset circuit, and has only the effect of changing the repetition rate of the reset cycle.

Figure 5A:
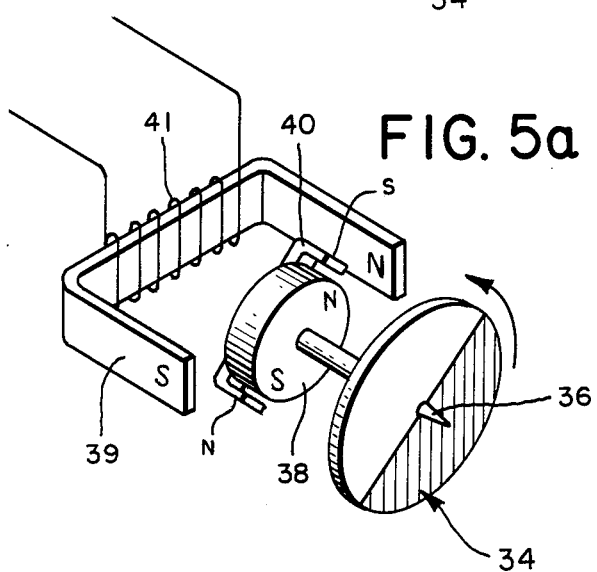
FIGS. 5a and 5b are diagrammatic views similar to FIGS. 4a and 4b, respectively, showing the indicator components of the fault indicator in transition between a reset state and a tripped state.
Figure 5B:
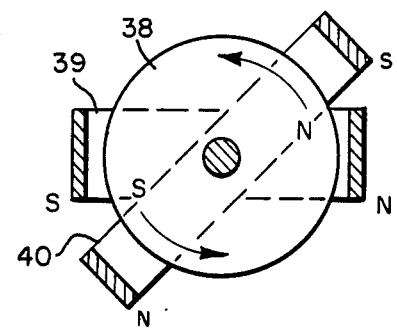
Figure 6A:
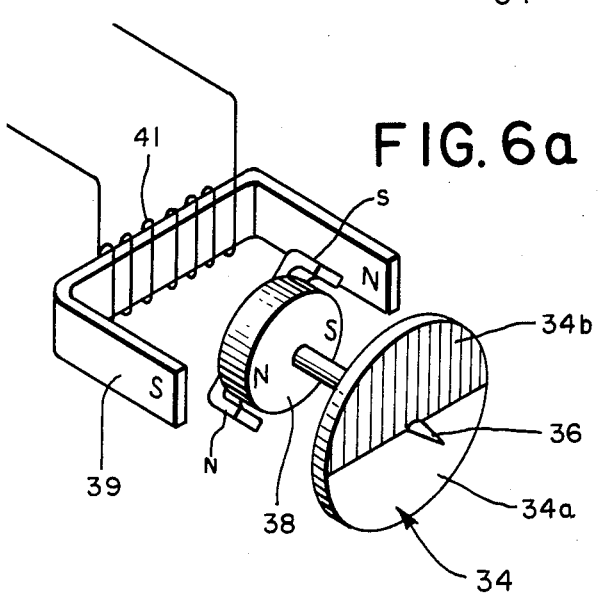
FIGS. 6a and 6b are diagrammatic views similar to FIGS. 4a and 4b, respectively, showing the indicator components of the fault indicator in a tripped state.
Figure 6B:
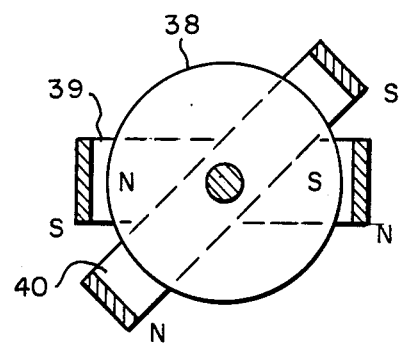

Upon occurrence of a fault current in conductor 12 trip capacitor 50 is discharged through SCR 53 and trip winding 41. The resulting magnetic flux in pole piece 39 reverses the magnetic polarities of the pole piece and causes rotation of indicator flag 34 to a trip-indicating position as previously described. In particular, the magnetic polarities of pole piece 39 are reversed as shown in FIGS. 5a-5b, causing the magnetic poles of the pole piece to repel the like poles of magnet 38 and induce a 180° rotation of the indicator flag. The auxiliary pole piece 40 assists in this rotation.

To preclude the possibility of simultaneous actuation of the trip and reset circuits and consequent failure of flag indicator 34 to register a fault, a reset coordination feature is provided in accordance with the invention to actuate and thus disable the reset circuit for a predetermined period of time following the fault, and to delay the actuation of the trip circuit until after actuation and disablement of the reset circuit. To this end, switch 54 is connected through a diode 65 and resistor 66 to the juncture of bilateral diodes 62 and 63. Upon closure of switch 54, an enabling signal is applied to the gate electrode of SCR 60, resistor 66 serving to limit current flow and diode 65 serving to prevent actuation of SCR 53 with application of normal reset signals to SCR 60 through bilateral diode 62. Since the enabling signal will ordinarily exceed the threshold of diode 63, the result is immediate conduction through SCR 60 and discharge of reset capacitor 51 through winding 41. Resistor 52 prevents any appreciable discharge of trip capacitor 50 at this time.

Capacitor 51 continues to discharge through winding 41 in a direction which resets the indicator flag for a finite reset period until the voltage across the capacitor falls to a level where SCR 60 ceases to conduct. The duration of this reset period is dependent on a number of circuit components and circuit parameters, including capacitor 51, winding 41 and the voltage developed by rectifier network 43 across capacitor 51, and in practice may typically be in the order of 0.16 millisecond Following the reset period the reset circuit is inoperative, and does not again become operative until capacitor 51 is charged sufficiently to exceed the voltage threshold of bilateral diodes 62 and 63. As previously developed, this recovery period may be in the order of two minutes or more.

During the recovery period of the reset circuit SCR 53 is rendered conductive to cause trip capacitor 50 to discharge through winding 41 in a direction which conditions indicator flag 54 to a fault-indicating state. This is accomplished by connecting switch 54 to the gate electrode of SCR 53 through an R-C network comprising resistors 55 and 58, capacitor 57, and bilateral diode 56, which introduces a predetermined delay period to the trip signal greater than the duration of the reset cycle. By reason of resistor 55 being connected between the gate and switch 54 the network is prevented from having a delaying effect on the signal applied to the gate electrode of SCR 60.

Thus, upon occurrence of a fault and closure of switch 54, the reset circuit is immediately actuated, and the trip circuit is only actuated after a predetermined delay period which is greater than the operating period of the reset circuit.

Figure 7:
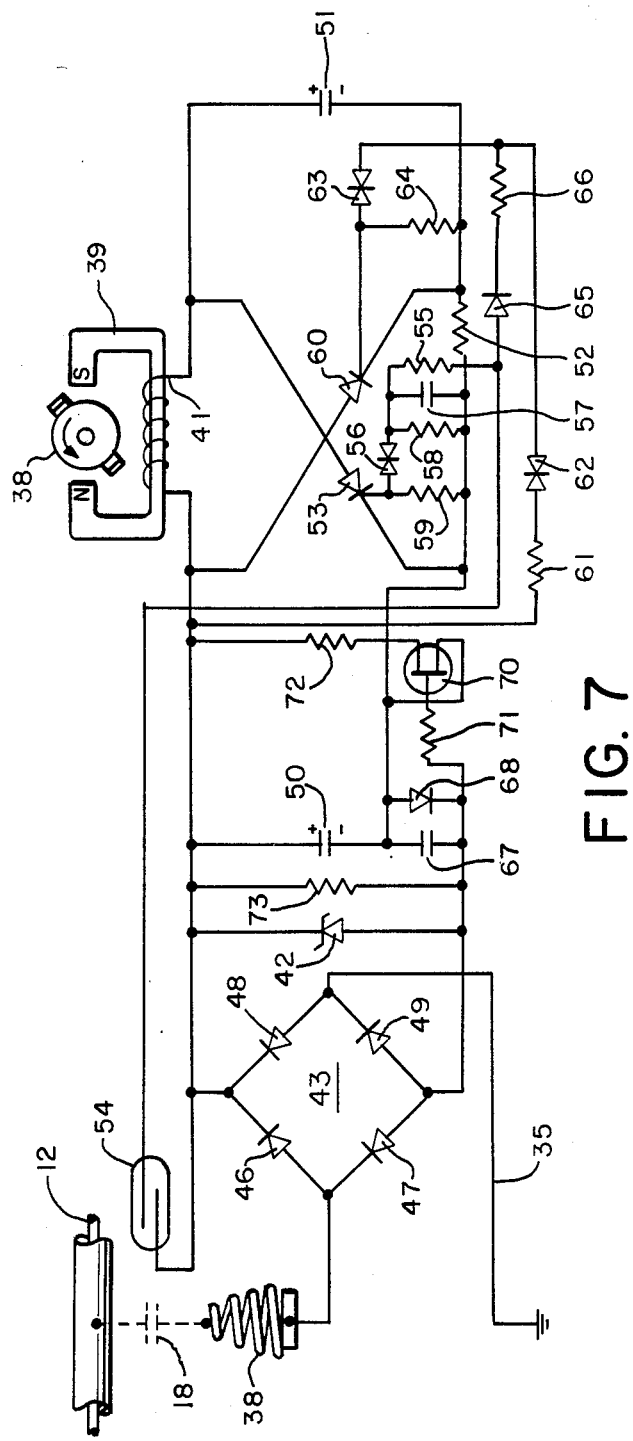
FIG. 7 is an electrical schematic diagram of an alternate reset-coordinated circuit for use in the fault indicator illustrated in FIG. 1.

An alternate circuit for use in a trip-coordinated fault indicator constructed in accordance with the invention is shown in FIG. 7. In such trip-coordinated fault indicators the trip circuit is inhibited upon restoration of power on the monitored conductor to prevent initial surge currents from causing a fault indication. To this end, the circuit includes an additional trip inhibit capacitor 67 in series with trip capacitor. A diode 57 is connected across capacitor 54 in a direction forward-biased to the charging current produced by rectifier network 43.

The juncture of capacitors 53 and 54 is connected to one principal electrode of an enhanced FET-type transistor 60. The remaining principal electrode of transistor 60 is connected through a resistor 61 to the positive polarity output terminal of rectifier network 43. The gate electrode of transistor 60 is connected through a resistor 62 to the negative polarity output terminal of the network.

In operation, in the presence of voltage on conductor 12 the voltage developed across trip inhibit capacitor 67 by the pulsating charge current developed by bridge rectifier network 43 is limited to the forward voltage drop of diode 68. By reason of resistor 71, this limited voltage appears as a reverse bias on the gate electrode of transistor 70, cuusing that device to be conditioned to a non-conductive state. Consequently, the transistor and resistor 72 have no effect on the charge contained on trip capacitor 50.

However, upon loss of voltage on conductor 12, and the consequent absence of output from bridge rectifier network 43, a portion of the charge contained in trip capacitor 50 is transferred through resistor 73 to trip inhibit capacitor 67, causing that capacitor to be rapidly charged in a reverse direction. As the capacitor receives the charge the voltage across the capacitor reverses polarity, and progressively increases in a reverse direction which tends to bias FET transistor 70 into conduction. Eventually the threshold level required for conduction in transistor 70 is reached, and that device is rendered conductive. This causes capacitor 50 to be discharged through resistor 72, rendering the trip circuit inoperative. Since the charge transfer between capacitor 50 and capacitor 67 takes place relatively quickly, typically in the order of 0.1 second, and resistor 72 has a relatively low resistance, trip capacitor 50 is discharged almost immediately following a voltage loss in the monitored conductor. Trip inhibit capacitor 67 is eventually also discharged through resistor 72.

The absence of charge in capacitor 50 precludes operation of the trip circuit, since it is this charge that is supplied to winding 41. Consequently, the fault indicator is desirably rendered inoperative for the detection and indication of fault currents following a voltage loss in conductor 12. Upon restoration of voltage in the conductor, capacitors 50 and 67 are again charged by the pulsating unidirectional current from bridge rectifier network 43. Since transistor 70 is rendered non-conductive at this time by the reverse-bias forward voltage drop of diode 68 appearing across trip inhibit capacitor 67 and applied to the transistor control electrodes, trip capacitor 50 is quickly recharged to its quiescent charge state and the trip circuit becomes operative. At the same time, reset capacitor 51 is charged through resistor 52, rendering the reset circuit operative.

The construction and operation of trip-coordinated fault indicators is described in the copending application of the present inventor entitled "Fault Indicator Having Improved Trip Inhibit Circuit", Ser. No. 845,591, filed Mar. 28, 1986. In a typical embodiment intended for use with 4400 volt 60 hertz alternating current capacitor 50 may have a value of 1 microfarad and capacitor 67 may have a value of 0.01 microfarad. Resistor 73 may have a value of 50 megohms and zener diode 53 may have a threshold voltage of 50 volts. These component values result in trip capacitor 50 having a discharge time constant of approximately 0.1 second. Transistor 70 may comprise a type IR 1Z3 enhanced FET, resistor 72 may have a value of 220 ohms, and resistor 71 may have a value of approximately 50 megohms.

Figure 8:
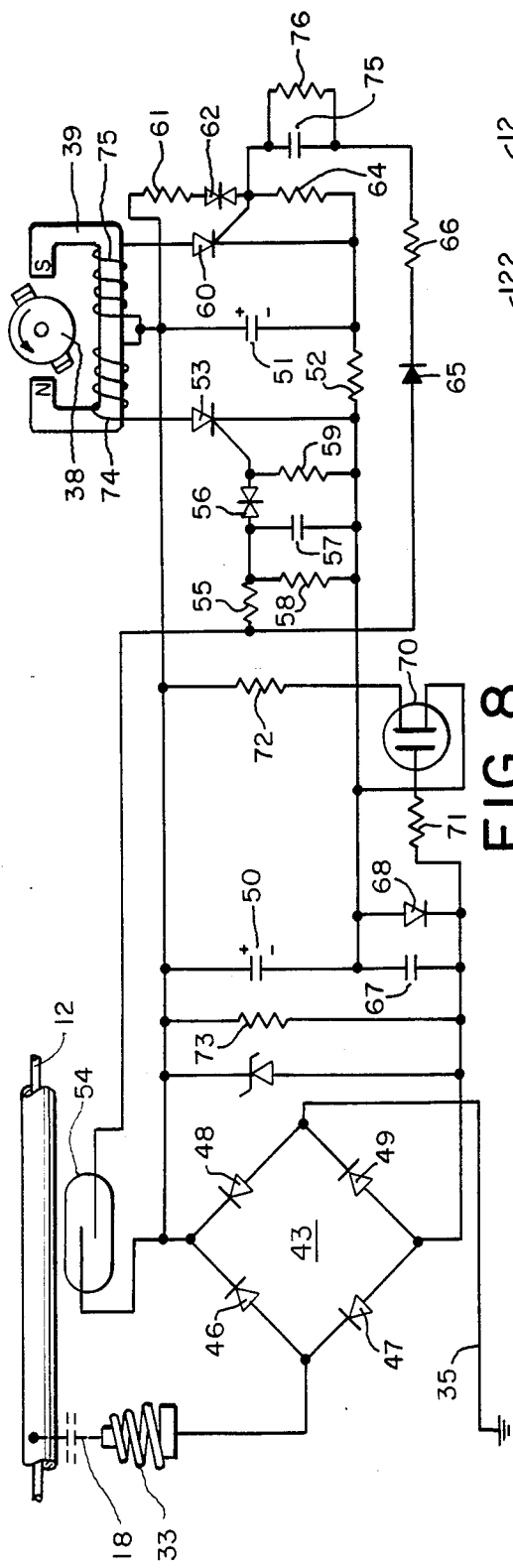
FIG. 8 is an electrical schematic diagram of an alternate two-winding reset coordinated circuit for use in the fault indicator illustrated in FIG. 1.

An alternate circuit for fault indicator 10 suitable for use with a dual-winding type flag indicator assembly is shown in FIG. 8. In this embodiment, two windings 74 and 75 are provided on the U-shaped magnetic pole piece. Reset capacitor 51 is connected to the juncture of the two windings, and through isolation resistor 52 to the output of rectifier network 43. Winding 74 is connected to SCR 53, which controls the discharge of trip capacitor 50 through the winding upon the occurrence of a fault, as previously described. Winding 74 is connected to SCR 60, which operates as previously described to control the discharge of reset capacitor 51 during the reset period. In accordance with one aspect of the invention, a differentiating network comprising a capacitor 75 and resistor 76 is provided in series-circuit relationship to the gate electrode of SCR 60 to improve its response time in activating the reset period upon the occurrence of a fault.

While the trip-inhibited fault indicator of the invention has been shown in conjunction with indicator assemblies of a conventional rotating indicator flag construction, it will be appreciated that the invention can be used with other types of indicators having other types of indicating elements. For example, the invention can be utilized in conjunction with a magnetic test point type indicator such as that described in U.S. Pat. No. 4,458,198 of the present inventor, or in conjunction with various types of electronic readouts which are conditioned between reset and fault identifying states by application of a momentary current.

An alternate embodiment of the invention suitable for mounting directly to a high voltage cable of a power distribution system is shown in FIGS. 9–17. As shown, this fault indicator 120 includes a generally cylindrical housing 121 formed of a hard electrically insulating weather-resistant material such as LEXAN a trademark of General Electric Company, of Schenectady, N.Y.). The detector 120 is secured to a conventional high voltage cable 122 including an internal conductor 12 by means of a pair of resilient inwardly-biased non-electrically conductive retaining arms 123 and 124. The retaining arms, which project rearwardly from housing 121, include end portions 123a and 124a, respectively, which are inwardly formed so as to grasp and hold cable 122 in close proximity to the rear wall 125 (FIG. 9) of housing 121. A pair of semi-resilient stiffening members 126 and 127 may be provided in close association with members 123 and 124 to assist in biasing the retaining members against cable 122.

Figure 9:
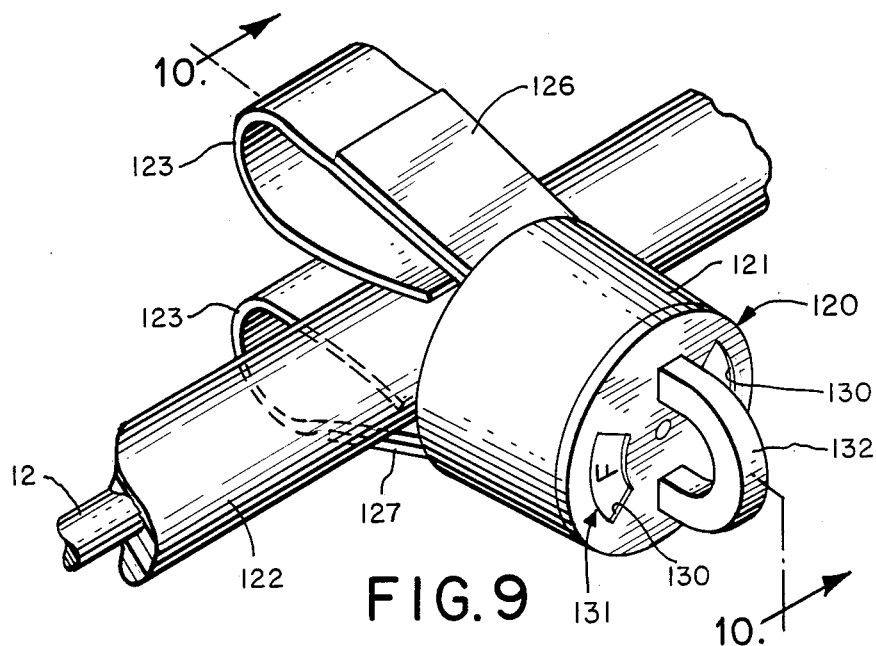
FIG. 9 is a perspective view illustrating a reset-coordinated fault indicator constructed in accordance with the present invention installed on a high voltage cable of a power distribution system.
Figure 10:
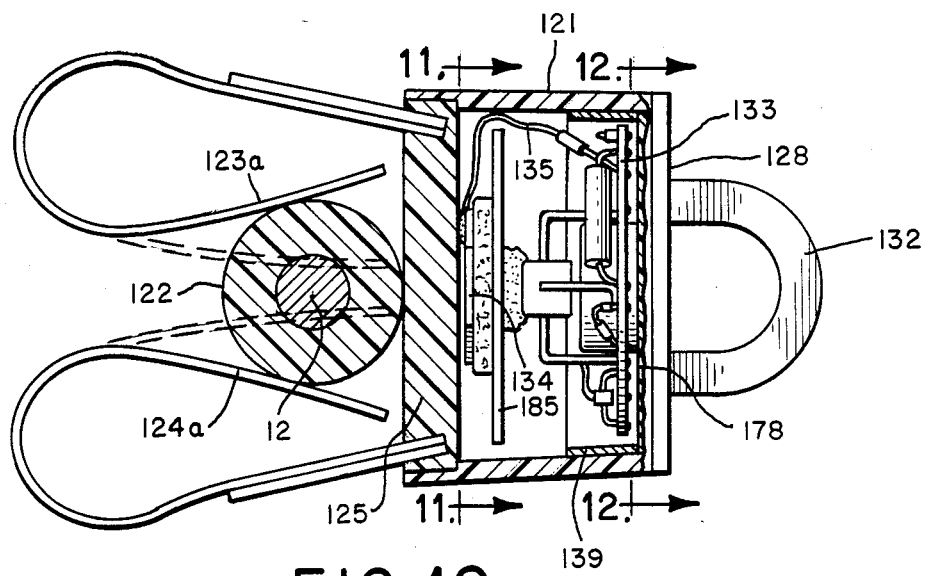
FIG. 10 is a cross-sectional view of the fault indicator taken along line 10—10 of FIG. 9.
Figure 11:
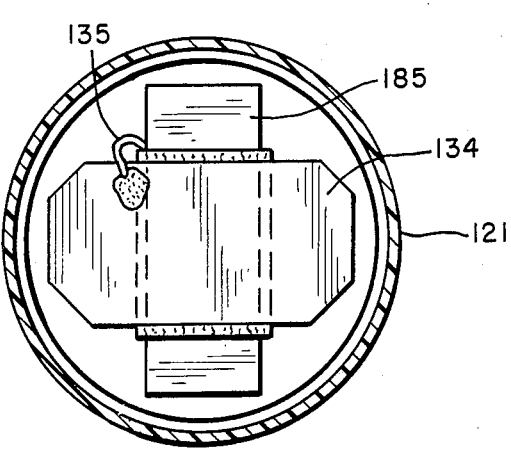
FIG. 11 is a cross-sectional view taken along line 11—11 of FIG. 10.
Figure 12:
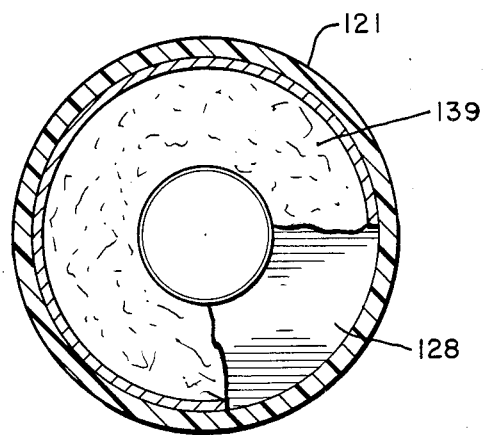
FIG. 12 is a cross-sectional view taken along line 12—12 of FIG. 10.

As shown to best advantage in FIG. 9, upon insertion of cable 122 between the retaining members, the ends of the retaining members are forced apart. This allows housing 121 to be pushed up against the cable, and as the cable abuts the housing the end portions of the retaining members push the cable into engagement. This cable attachment arrangement is described and claimed in the copending application of the present inventor, entitled "Cable Mounted Capacitively-Coupled Circuit Condition Indicating Device", Ser. No. 845,592, filed Mar. 28, 1986.

To provide an indication of fault occurrence, detector 120 includes on the front wall 128 of housing 121 a pair of windows 130 through which an indicator flag assembly 131 provides a visible indication of the occurrenct of a fault current. A handling loop 132 having ends anchored in the front wall extends from housing 121 to receive the hooked end of a lineman's tool (not shown) to facilitate installation and removal of the indicator from cable 122.

The various circuit components of the fault indicator are mounted on a circuit board 133 contained within housing 121. A first electrostatic pick-up point between the detector circuitry and the electric field surrounding conductor 122 is provided by a flat electrically conductive plate 134 positioned within housing 121 near rear wall 125 and electrically connected to the circuitry by a conductor 135. A second electrostatic pick-up point radially displaced from the first pick-up point relative to conductor 12 is provided by an electrically conductive metal ring 139 on the opposite inside surface of housing 121 adjacent and behind front wall 128. This housing construction, which advantageously provides sufficient excitation to the indicator circuitry without the use of external ground plane elements, is described in detail in the aforementioned copending application Ser. No. 845,592 of the present inventor.

Figure 13:
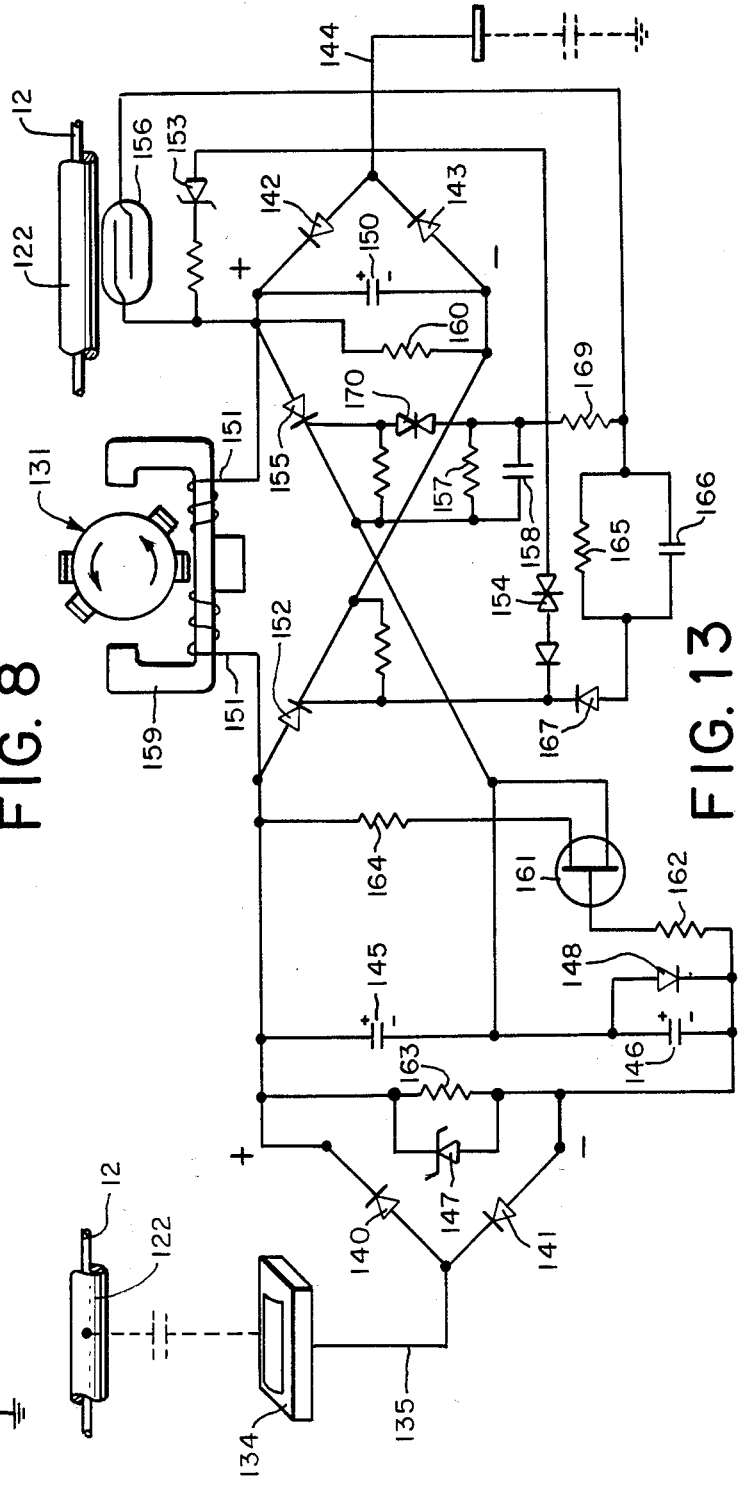
FIG. 13 is an electrical schematic diagram of the fault indicator illustrated in FIG. 9.

Referring to FIG. 13, the circuitry of fault indicator 120 is seen to comprise a first rectifier network comprising a pair of rectifier diodes 140 and 141 connected to the capacitive pickup plate 134 through conductor 135. A second rectifier network comprising a pair of rectifier diodes 142 and 143 are connected through a conductor 144 to the electrically conductive coating 139 providing capacitive coupling to ground. Together, the two rectifier networks provide rectification of the alternating current derived from the electric field surrounding conductor 12 to provide energization of the trip, reset and trip inhibit circuits of the fault indicator.

The pulsating direct current developed by diodes 140 and 141 during the presence of voltage on conductor 12 is applied to a trip capacitor 145 and a trip inhibit capacitor 146 connected across the output terminals of the network. A zener diode 147 limits the voltage developed across the capacitors to the threshold voltage of the zener diode, and a forward-biased diode 148 connected across capacitor 146 limits the voltage across that device during the charge cycle to the forward drop of the diode, typically in the order of 0.7 volts.

The pulsating direct current developed by diodes 142 and 143 is applied to a reset capacitor 150 connected across the output of the second rectifier network to cause that capacitor to also be charged during normal current flow.

To provide for periodic reset of the fault indicator, capacitor 150 is periodically discharged through the series-connected windings 151 of flag indicator assembly 131. To this end, a silicon controlled rectifier (SCR) 152 is periodically conditioned into conduction by conduction through a zener diode 153 and bilateral diode 154 in the gate circuit of the SCR upon the voltage across capacitor 150 exceeding a predetermined threshold level.

Following the discharge of reset capacitor 150 through windings 151, the voltage across the capacitor drops and SCR 152 ceases to conduct. Capacitor 150 then begins to recharge until the voltage across reset capacitor 150 again reaches the threshold level of the zener and bilateral diodes, at which time conduction through SCR 152 is reestablished and another reset cycle is accomplished.

Upon occurrence of a fault current in conductor 12, trip capacitor 145 is caused after a predetermined time delay, in accordance with the invention, to discharge in a reverse direction through windings 151 through a second silicon controlled rectifier 155. This results from closure of reed switch contacts 156 positioned in close magnetic proximity to cable 122 and connected to the control electrode of SCR 155 through a delay circuit including a resistor 157 and a capacitor 158.

Trip capacitor 145 continues to discharge until the discharge current is no longer sufficient to maintain conduction through SCR 155. The magnetic pole piece 159 of flag indicator assembly 131 however remains biased in a magnetic polarity which maintains the indicator flag thereof in a fault indicating position. Upon restoration of normal current in conductor 12, it remains for the reset circuit of reset capacitor 150 to remagnetize pole piece 159 to opposite magnetic polarities so as to reposition the indicator flag to a reset-indicating position.

To prevent false fault current indications as a result of inrush current associated with initial powerup of conductor 12, the fault indicator includes the trip inhibit capacitor 146 and associated circuitry for discharging trip capacitor 145 upon loss of voltage on the conductor. In particular, the control electrodes of an enhanced FET-type 161 are connected across trip inhibit capacitor 146 through a resistor 162. Upon loss of excitation trip capacitor 145 is caused to partially discharge through a resistor 163 into capacitor 146, causing the voltage across that device to reverse polarity and progressively increase in the reverse direction as the device is charged. Eventually the threshold voltage of transistor 161 is reached and the transistor is rendered conductive by the applied bias from capacitor 146, causing trip capacitor 145 to rapidly discharge through a resistor 164 and therefore be unavailable for providing trip current to windings 151. Thus, the fault indicator is initially non-responsive to fault current occurring following the loss of voltage in conductor 12, and does not become operative for this purpose until capacitor 145 again becomes charged.

Upon occurrence of a fault, reed switch 156 closes and an enabling current is applied to SCR 152 through a differentiating network comprising a resistor 165 and capacitor 166, and a diode 167 to immediately discharge reset capacitor 150 through windings 151, rendering the reset circuit inoperative pending the recharging of capacitor 150 by diodes 142 and 143. A resistor 168 may be connected across the capacitor to establish a minimum line voltage necessary for the capacitor to attain an operable charge level. SCR 155 is rendered conductive after a elay period established by resistor 157 and capacitor 158, and a series-connected resistor 169 and bilateral diode 170.

The operation of flag indicator assembly 131 is illustrated in FIGS. 14-17. The indicator, which may be identical in construction and operation to that described in U.S. Pat. No. 4,495,489 of the present inventor, is seen to include an indicator flag 175 rotatably mounted on a shaft 176 within housing 121. The indicator flag includes indicator segments on either side of the axis of rotation which preferably each extend less than 90° around the axis of rotation.

When aligned as shown in FIGS. 14a-14b the flag segments are masked and are not visible to the observer through windows 130. However, upon occurrence of a fault current, the indicator flag rotates 90° such that the indicator segments are positioned as shown in FIGS. 16a-16b and are visible through windows 130. The indicator segments are preferably colored red, or another highly visible color, to clearly indicate the occurrence of a fault current when viewed through the windows.

Actuation of flag member 175 between reset and fault indicating positions is accomplished by an annular flag actuator magnet 177 which is rotatably coupled to flag member 175 by shaft 176. The shaft is maintained in alignment with the axis of indicator housing 121 by means of a bearing surface in a divider wall 178 (FIG. 10), which also provides a reset-indicating surface viewable through windows 130 when the indicator flag is in its reset position. This surface is preferably colored white, or some other color contrasting with the color of the indicator flag segments, to clearly indicate a reset condition when viewed through the windows.

Actuator magnet 177, which may be formed of a magnetic material having a high coercive force, such as ceramic, is formed to provide four magnetic poles of opposite polarity, with opposite polarities every 90° about the circumference of the magnet. Actuator magnet 177, and hence indicator flag 175, are biased to the position shown in FIGS. 14a and 14b when the fault indicator 120 is in a non-trip or reset condition by means of the generally cross-shaped magnetic pole piece 159, which may be formed of a magnetic material having a relatively low coercive force, such as chrome steel. The pole piece includes four magnetic poles in magnetic communication with flag actuator magnet 177. The pole piece 159 is mounted such that the four magnetic poles extend to positions adjacent the magnetic poles of actuator magnet 177. A magnetic shield 185 (FIGS. 10 and 11) comprising a flat plate of magnetically conductive material is provided between the actuator assembly and conductor 12 to shield the actuator assembly from the magnetic field which accompanies occurrence of a fault current in conductor 12.

During normal circuit operation the poles of pole piece 159 are biased to the magnetic polarities indicated in FIGS. 14a and 14b. As a result, the opposite polarity poles of flag actuator magnet 177 are attracted to position the indicator flag 175 as shown, with the indicator segments thereof vertically aligned and out-of-view of windows 130. Thus, all that is seen is the white reset-indicating surface of divider 178.

Upon loss of voltage in conductor 12, pole piece 159 is remagnetized to the magnetic polarities shown in FIGS. 15a–15b and 16a–16b by momentary energization of magnetic windings 151, which are located on the pole piece, as shown. As a result, the poles of flag actuator magnet 177 are repelled by adjacent like-polarity poles of the pole piece and the indicator flag is caused to rotate 90° to the indicating position shown in FIGS. 16a–16b. In this position, the red indicator segments of the indicator flag 165 are visible through windows 130 and a lineman viewing the fault indicator is advised that a fault current has occurred in conductor 12.

The indicator flag 175 remains in the fault-indicating position until the poles of pole piece 159 are subsequently remagnetized to the magnetic polarity shown in FIGS. 14a–14b by momentary application of a reset current to windings 151 as shown in FIGS. 17a–17b. This causes flag actuator magnet 177 to again be repelled by the adjacent poles of pole piece 159 so as to rotate indicator flag 175 to a vertical position, as shown in FIGS. 13a–13b.

The high input impedance provided by the embodiment of FIGS. 9–17 allows the fault indicator to be utilized on very high impedance test points, where coupling to a monitored conductor may range from 5 to only 1 picofarad, and on high voltage cables, where coupling to the conductor may be only 0.5 picofarad, without the need for external grounding connections or electrically conductive members projecting from the housing.

Figure 18:
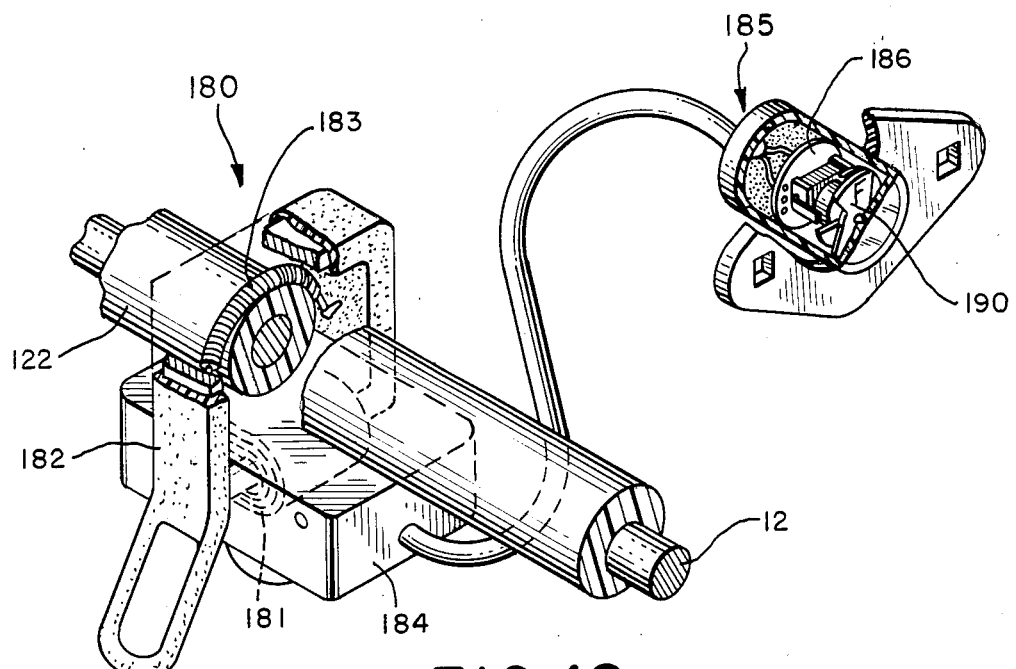
FIG. 18 is a perspective view of an indicatively coupled reset-coordinated self-resetting fault indicator constructed in accordance with the invention.
Figure 19:
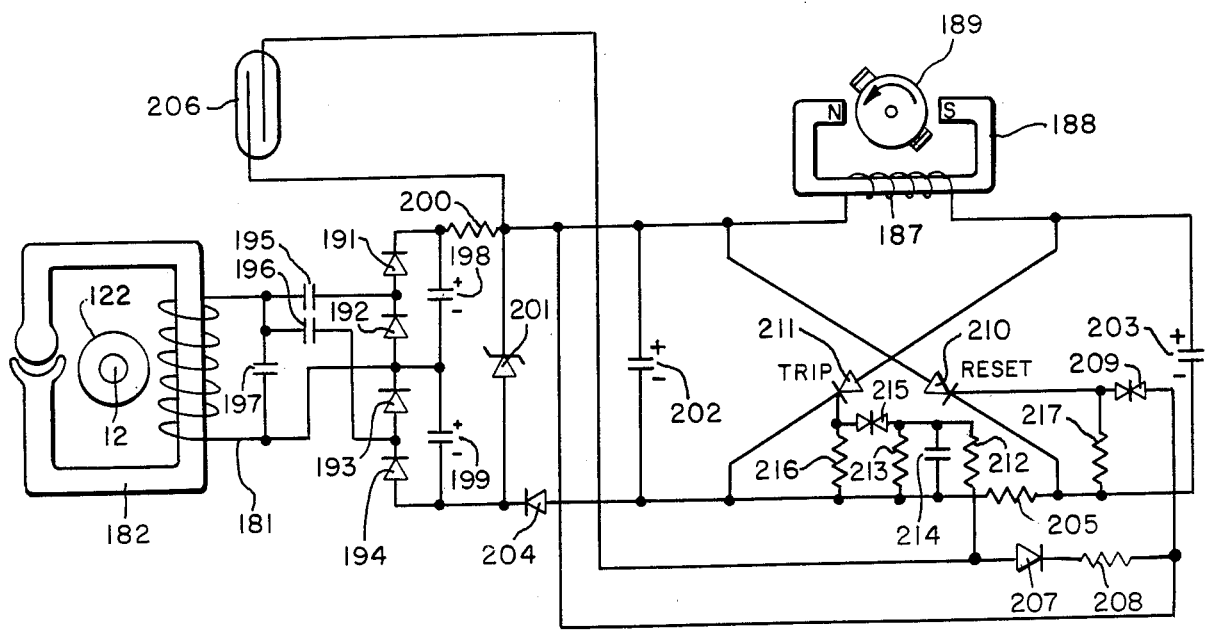
FIG. 19 is an electrical schematic diagram of the fault indicator illustrated in FIG. 18.

The invention can also be incorporated in inductively couled fault indicators, as illustrated in FIGS. 18 and 19. In the fault indicator 180 shown, a winding 181 is magnetically coupled to the conductor 12 of a cable 122 by magnetic core assembly 182, which may be as described in U.S. Pat. No. 4,456,873 of the present inventor. A helical spring 183 may be provided to hold the cable against a housing 184 within which circuitry for controlling a remote indicator module 185 may be contained. A conventional magnetically actuated indicator flag assembly 186, including a magnetic winding 187, a U-shaped pole piece 188, an actuator magnet 189 and a rotatable indicator flag 190, may be provided within module 185.

A voltage quadrupler comprising diodes 191–194 and capacitors 195–199 is connected to winding 181 to develop operating power in a manner well known to the art. A resistor 200 and zener diode 201 provide charging current to a trip capacitor 202 and a reset capaitor 203. Capacitor 202 is charged directly through a diode 204, and capacitor 203 is charged through an isolation resistor 205.

Upon occurrence of a fault, a reed switch 206 closes to apply enabling current througha diode 207, resistor 208, and bilateral diode 209 to the gate electrode of an SCR 210, which conducts to discharge reset capacitor 203 through winding 187.

In accordance with the invention, an SCR 211 is next enabled after a delay to discharge trip capacitor 202 through the winding to cause a fault indication. A network consisting of resistors 212 and 213, a capacitor 214 and a bilateral diode 215 provide the necessary delay. Resistors 216 and 217 provide necessary ground returns for the gate electrodes.

Thus, the reset circuit of fault indicator 180 is tripped immediately upon occurrence of a fault, rendering it inoperative pending the completion of a subsequent charging cycle. Then, while the reset circuit is operative, the trip circuit is actuated to condition the indicator to a fault-indicating state. Since the reset circuit is inoperative when the fault circuit is actuated, the possibility of simultaneous actuation of the two circuits is eliminated.

In practice, the delay period utilized in actuating the trip circuit following a fault will depend on the duration of the reset period, which in turn will depend on circuit parameters. In one successful embodiment of the invention, for example, a fault indicator having a 0.16 millisecond reset period and a 0.4 millisecond trip period, may have a total trip delay of 0.28 milliseconds, which provides a space between the end of the reset pulse and the beginning of the trip pulse of 12 milliseconds, and a total reset and trip period of 68 milliseconds. However, it will be understood that other pulse widths and delay periods may be appropriate in other applications.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating the occurrence of a fault current in a monitored electrical conductor of an alternating current power distribution system, comprising:
    status indicating means having a reset-indicating state and a fault-indicating state;
    trip circuit means for conditioning said status indicating means to said fault-indicating state in response to the occurrence of a fault current in the conductor;
    reset circuit means periodically operable for a predetermined reset period for conditioning said status indicating means to said reset-indicating state, and inoperable for a predetermined recovery period following each such reset period; and
    said trip circuit means rendering said reset circuit means initially operable upon occurrence of a fault, and conditioning said status indicating means to said fault-indicating state during said recovery period following a trip delay per greater than said predetermined reset period to preclude simultaneous operation of said trip and reset circuits.

2. A fault indicator as defined in claim 1 wherein said reset circuit means include a reset capacitor for supplying operating current thereto, and a discharge circuit operable in conjunction with said reset capacitor for establishing said predetermined reset peiod.

3. A fault indicator as defined in claim 2 wherein said reset capacitor is capacitively coupled to the monitored electrical conductor.

4. A fault indicator as defined in claim 3 wherein said trip circuit means include switch means responsive to the occurrence of a fault in the monitored conductor, and said reset circuit means are responsive to the closure of said switch means for initiating said reset period.

5. A fault indicator as defined in claim 4 wherein said switch means comprise a reed switch in magnetic communication with the monitored conductor.

6. A fault indicator as defined in claim 2 wherein said reset circuit means include a charging circuit for said reset capacitor, said charging circuit forming in conjunction with said reset capacitor an RC timing circuit for establishing said recovery period.

7. A fault indicator as defined in claim 6 wherein wherein said recovery period is substantially greater than said reset period.

8. A fault indicator as defined in claim 1 including a trip coordination circuit for inhibiting said trip circuit for a predetermined coordination period following initial power-up of the monitored conductor.

9. A fault indicator as defined in claim 8 wherein the operation of said coordination circuit is substantially independent of the operation of said reset circuit.

10. A fault indicator as defined in claim 1 wherein said trip circuit means include a trip capacitor for powering said trip circuit, and an RC timing circuit operative in conjunction with said trip capacitor for establishing said trip delay period.

11. A fault indicator as defined in claim 10 wherein said trip capacitor is capacitively coupled to the monitored electrical conductor.

12. A fault indicator for indicating the occurrence of a fault current in a monitored electrical conductor of an alternating current power distribution system, comprising:
    status indicating means having a reset-indicating state and a fault-indicating state;
    reset circuit means periodically operable for a predetermined reset period for conditioning said status indicating means to said reset-indicating state, and inoperative for a predetermined recovery period following each such reset period, said reset circuit means including a reset capacitor for supplying operating current thereto, a discharge circuit operable in conjunction with said reset capacitor for establishing said reset period, and a charging circuit operable in conjunction with said reset capacitor for establishing said recovery period; and
    trip circuit means for rendering said reset circuit operable, and including a trip capacitor and an associated RC time constant circuit for conditioning said status indicating means to said fault-indicating state during said recovery period after a predetermined trip delay period greater than said reset period, in response to the occurrence of a fault current in the monitored conductor, whereby simultaneous conditioning of said indicating means by said reset and trip circuit means is prevented.

13. A fault indicator as defined in claim 12 wherein said reset and trip capacitors are capacitively coupled to the monitored electrical conductor.

14. A fault indicator as defined in claim 12 wherein said recovery period is substantially greater than said reset period.

15. A fault indicator as defined in claim 12 wherein said trip circuit means include switch means responsive to the occurrence of a fault in the monitored conductor, and said reset circuit means are responsive to the closure of said switch means for initiating said reset period.

16. A fault indicator as defined in claim 15 wherein said switch means comprise a reed switch in magnetic communication with the monitored conductor.

17. A fault indicator as defined in claim 12 including a trip coordination circuit for inhibiting said trip circuit for a predetermined coordination period following initial power-up of the monitored conductor.

18. A fault indicator as defined in claim 17 wherein the operation of said coordination circuit is substantially independent of the operation of said reset circuit.

19. A fault indicator as defined in claim 12 wherein said recovery period is substantially greater than said reset period.

* * * * *